(12) United States Patent
Owaki et al.

(10) Patent No.: US 10,389,363 B2
(45) Date of Patent: Aug. 20, 2019

(54) OSCILLATOR, ELECTRONIC APPARATUS, AND VEHICLE

(71) Applicant: SEIKO EPSON CORPORATION, Tokyo (JP)

(72) Inventors: Takuya Owaki, Minowa-machi (JP); Naohisa Obata, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 152 days.

(21) Appl. No.: 15/450,579

(22) Filed: Mar. 6, 2017

(65) Prior Publication Data

US 2017/0272083 A1 Sep. 21, 2017

(30) Foreign Application Priority Data

Mar. 18, 2016 (JP) ................................. 2016-055870

(51) Int. Cl.
*H03B 5/04* (2006.01)
*H03B 5/32* (2006.01)
(Continued)

(52) U.S. Cl.
CPC ................ *H03L 1/04* (2013.01); *H03B 1/02* (2013.01); *H03B 5/04* (2013.01); *H03B 5/32* (2013.01);
(Continued)

(58) Field of Classification Search
CPC ... H03B 5/04; H03B 5/30; H03B 5/32; H03B 2200/009; H03H 9/0547; H03L 1/00;
(Continued)

(56) References Cited

U.S. PATENT DOCUMENTS

| | | | |
|---|---|---|---|
| 5,557,196 A | * | 9/1996 | Ujiie ...................... G01R 29/26 324/76.13 |
| 5,708,687 A | | 1/1998 | Powell et al. |

(Continued)

FOREIGN PATENT DOCUMENTS

| | | |
|---|---|---|
| JP | 3841304 B2 | 11/2006 |
| JP | 2010-103803 A | 5/2010 |

(Continued)

OTHER PUBLICATIONS

U.S. Appl. No. 15/928,228, filed Mar. 22, 2018 in the name of Obata et al.

(Continued)

*Primary Examiner* — Levi Gannon
(74) *Attorney, Agent, or Firm* — Oliff PLC

(57) ABSTRACT

A temperature-compensated oscillator includes a resonator element, an oscillating circuit, and a temperature compensation circuit, and in a case of varying temperature in a temperature range of ±5° C. centered on a reference temperature in intervals of 6 minutes, and assuming observation period as τ, a wander performance fulfills a condition that an MTIE value is equal to or shorter than 6 ns in a range of 0 s<τ≤0.1 s, the MTIE value is equal to or shorter than 27 ns in a range of 0.1 s<τ≤1 s, the MTIE value is equal to or shorter than 250 ns in a range of 1 s<τ≤10 s, the MTIE value is equal to or shorter than 100 ns in a range of 10 s<τ≤1700 s, and the MTIE value is equal to or shorter than 6332 ns in a range of 100 s<τ≤1000 s.

11 Claims, 8 Drawing Sheets

(51) Int. Cl.
*H03L 1/04* (2006.01)
*H03L 1/02* (2006.01)
*H03B 1/02* (2006.01)

(52) U.S. Cl.
CPC ........ *H03L 1/028* (2013.01); *H03B 2200/009* (2013.01); *H03B 2201/038* (2013.01)

(58) Field of Classification Search
CPC . H03L 1/02; H03L 1/026; H03L 1/028; H03L 1/04
USPC .................... 331/68–70, 154, 156, 158, 176
See application file for complete search history.

(56) References Cited

U.S. PATENT DOCUMENTS

| | | | |
|---|---|---|---|
| 6,229,249 B1 * | 5/2001 | Hatanaka | H03B 5/04 310/348 |
| 6,288,614 B1 | 9/2001 | Linss | |
| 6,292,066 B1 | 9/2001 | Shibuya et al. | |
| 7,456,552 B2 | 11/2008 | Chiba et al. | |
| 8,084,917 B2 | 12/2011 | Yamanaka | |
| 9,362,921 B2 | 6/2016 | Owaki et al. | |
| 9,712,109 B2 | 7/2017 | Obata | |
| 2002/0158700 A1 | 10/2002 | Nemoto | |
| 2002/0180544 A1 | 12/2002 | Fukayama et al. | |
| 2003/0064694 A1 | 4/2003 | Oka et al. | |
| 2004/0208256 A1 | 10/2004 | Spijker et al. | |
| 2006/0202772 A1 | 9/2006 | Ishikawa et al. | |
| 2008/0007363 A1 | 1/2008 | Nagatomo et al. | |
| 2008/0068102 A1 * | 3/2008 | Moriya | H03B 5/36 331/68 |
| 2008/0079501 A1 | 4/2008 | Hulfachor et al. | |
| 2009/0201096 A1 | 8/2009 | Hardy et al. | |
| 2011/0273333 A1 | 11/2011 | Terasawa et al. | |
| 2014/0119390 A1 | 5/2014 | Rabinovich | |
| 2014/0320181 A1 | 10/2014 | Mitric et al. | |
| 2015/0123743 A1 | 5/2015 | Kiyohara | |
| 2016/0285462 A1 | 9/2016 | Takamuku et al. | |
| 2016/0285463 A1 | 9/2016 | Owaki et al. | |
| 2016/0285464 A1 | 9/2016 | Obata | |
| 2017/0099040 A1 | 4/2017 | Obata | |
| 2017/0272081 A1 * | 9/2017 | Chiang | H03L 1/02 |
| 2018/0241401 A1 | 8/2018 | Aylward | |

FOREIGN PATENT DOCUMENTS

| | | |
|---|---|---|
| JP | 2014-053663 A | 3/2014 |
| JP | 2014-107862 A | 6/2014 |
| JP | 2016-127468 A | 7/2016 |
| JP | 2016-127469 A | 7/2016 |
| JP | 2016-187152 A | 10/2016 |
| JP | 2016-187153 A | 10/2016 |
| JP | 2016-187154 A | 10/2016 |
| JP | 2017/073624 A | 4/2017 |

OTHER PUBLICATIONS

U.S. Appl. No. 15/855,460, filed Dec. 27, 2017 in the name of Maki et al.
Apr. 22, 2019 Office Acton issued in U.S. Appl. No. 15/855,460.
Jul. 1, 2019 Office Acton issued in U.S. Appl. No. 15/855,460.
Jun. 3, 2019 Office Action issued in U.S. Appl. No. 15/926,228.

* cited by examiner

OSCILLATOR, ELECTRONIC APPARATUS, AND VEHICLE

BACKGROUND

1. Technical Field

The present invention relates to an oscillator, an electronic apparatus, and a vehicle.

2. Related Art

A temperature-compensated crystal oscillator (TCXO) has a quartz crystal resonator and an integrated circuit (IC) for oscillating the quartz crystal resonator, wherein the IC compensates (performs temperature compensation on) the deviation (frequency deviation) from the desired frequency (nominal frequency) of the oscillation frequency of the quartz crystal resonator in a predetermined temperature range, and thus, high frequency accuracy can be obtained. Such a temperature-compensated crystal oscillator (TCXO) is disclosed in, for example, JP-A-2014-53663.

Further, the temperature-compensated crystal oscillator is high in frequency stability, and is therefore used for communication equipment and so on for which high performance and high reliability are required.

The frequency signal (the oscillation signal) output from the oscillator includes phase fluctuation. Among the phase fluctuation of the frequency signal, the fluctuation with a frequency lower than 10 Hz is called wander. In ITU-T Recommendation G.813, there is defined the wander performance in the state in which the temperature is constant.

However, in the practical usage, it is difficult to make the oscillator operate under the environment in which the temperature is kept constant. For example, even if the oscillator is compliant with ITU-T Recommendation G.813, there is a possibility that sufficient performance cannot be exerted under a severe temperature environment such as the case in which the oscillator is used for a car navigation system or a variety of vehicular gauges, and the case in which the oscillator is incorporated in a device, the temperature of which changes rapidly due to the action of a fan or the like.

SUMMARY

An advantage of some aspects of the invention is to provide an oscillator available for an electronic apparatus and a vehicle for which high frequency stability is required even under the severe temperature environment. Another advantage of some aspects of the invention is to provide an electronic apparatus and a vehicle each including the oscillator described above.

The invention can be implemented as the following forms or application examples.

APPLICATION EXAMPLE 1

An oscillator according to this application example is a temperature-compensated oscillator including a resonator element, an oscillating circuit, and a temperature compensation circuit, wherein in a case of varying temperature in a temperature range of ±5° C. centered on a reference temperature in intervals of 6 minutes, and assuming observation period as $\tau$, a wander performance fulfills a condition that an MTIE value is equal to and shorter than 6 ns in a range of $0 \text{ s} < \tau \le 0.1 \text{ s}$, the MTIE value is equal to and shorter than 27 ns in a range of $0.1 \text{ s} < \tau \le 1 \text{ s}$, the MTIE value is equal to and shorter than 250 ns in a range of $1 \text{ s} < \tau \le 10 \text{ s}$, the MTIE value is equal to and shorter than 1700 ns in a range of $10 \text{ s} < \tau \le 100$ s, and the MTIE value is equal to and shorter than 6300 ns in the range of $100 \text{ s} < \tau \le 1000 \text{ s}$.

It is also possible to configure a variety of types of oscillation circuit such as a pierce oscillator circuit, an inverter type oscillation circuit, a Colpitts oscillator circuit, or a Hartley oscillator circuit using the resonator element and the oscillating circuit.

In the oscillator according to this application example, in a case of varying temperature in a temperature range of ±5° C. centered on a reference temperature in intervals of 6 minutes, and assuming observation period as $\tau$, the wander performance fulfills the condition that an MTIE value is equal to and shorter than 6 ns in a range of $0 \text{ s} < \tau \le 0.1 \text{ s}$, the MTIE value is equal to and shorter than 27 ns in a range of $0.1 \text{ s} < \tau \le 1 \text{ s}$, the MTIE value is equal to and shorter than 250 ns in a range of $1 \text{ s} < \tau \le 10 \text{ s}$, the MTIE value of equal to and shorter than 1700 ns in a range of $10 \text{ s} < \tau \le 100 \text{ s}$, and the MTIE value is equal to and shorter than 6300 ns in the range of $100 \text{ s} < \tau \le 1000 \text{ s}$, and there is exerted the superior wander performance even in the environment in which the temperature fluctuates. Therefore, the oscillator according to this application example is also available for the electronic apparatus and the vehicle for which high frequency stability is required even in a severe temperature environment.

APPLICATION EXAMPLE 2

In the oscillator according to the application example described above, in a case of keeping the temperature constant at the reference temperature, the wander performance may fulfill a condition that the MTIE value is equal to or shorter than 15 ns in a range of $0.1 \text{ s} < \tau \le 1 \text{ s}$, the MTIE value is equal to or shorter than 23 ns in a range of $1 \text{ s} < \tau \le 10$ s, the MTIE value is equal to or shorter than 100 ns in a range of $10 \text{ s} < \tau \le 100 \text{ s}$, and the MTIE value is equal to or shorter than 700 ns in the range of $100 \text{ s} < \tau \le 1000 \text{ s}$.

The oscillator according to this application example has such a superior wander performance, compared to the related-art temperature-compensated crystal oscillator, as to fulfill, in a case of keeping the temperature constant at a reference temperature, the condition that the MTIE value is equal to or shorter than 15 ns in the range of $0.1 \text{ s} < \tau \le 1 \text{ s}$, the MTIE value is equal to or shorter than 23 ns in a range of $1 \text{ s} < \tau \le 10 \text{ s}$, the MTIE value is equal to or shorter than 100 ns in a range of $10 \text{ s} < \tau \le 100 \text{ s}$, and the MTIE value is equal to or shorter than 700 ns in the range of $100 \text{ s} < \tau \le 1000 \text{ s}$. Therefore, the oscillator according to this application example is also available for the electronic apparatus and the vehicle for which high frequency stability is required.

APPLICATION EXAMPLE 3

In the oscillator according to the application example described above, the oscillator may further include a first container housing the resonator element, an electronic component provided with the oscillating circuit and the temperature-compensation circuit, and a second container housing the first container and the electronic component, and the electronic component maybe bonded to the first container, a space may be disposed between an inner surface of the second container and the first container, and a space may be disposed between an inner surface of the second container and the electronic component.

In the oscillator according to this application example, since the electronic component is bonded to the first container, the space is disposed between the inner surface of the second container and the first container, and the space is disposed between the inner surface of the second container and the electronic component, the heat generated in the electronic component is conducted to the resonator element in a short period of time to decrease the temperature difference between the electronic component and the resonator element. As a result, the error in temperature compensation by the temperature compensation circuit decreases, and thus, the superior wander performance described above can be realized.

APPLICATION EXAMPLE 4

In the oscillator according to the application example described above, the first container may include a base, and a lid adapted to seal the base and made of metal, and the electronic component may bonded to the lid.

In the oscillator according to this application example, since the material of the lid to which the electronic component is bonded is metal high in thermal conductivity, the heat generated in the electronic component is conducted to the resonator element in a short period of time to decrease the temperature difference between the electronic component and the resonator element. As a result, the error in temperature compensation by the temperature compensation circuit decreases, and thus, the superior wander performance described above can be realized.

APPLICATION EXAMPLE 5

In the oscillator according to the application example described above, the space in the second container may be in a vacuum state.

In the oscillator according to this application example, since the space in the second container is in the vacuum state, it is possible to reduce the influence of the temperature fluctuation outside the second container on the electronic component and the resonator element.

APPLICATION EXAMPLE 6

An oscillator according to this application example is a temperature-compensated oscillator including a resonator element, an oscillating circuit, and a temperature compensation circuit, wherein in a case of keeping the temperature constant at a reference temperature, the wander performance fulfills the condition that the MTIE value is equal to or shorter than 15 ns in the range of $0.1 \text{ s} < \tau \leq 1 \text{ s}$, the MTIE value is equal to or shorter than 23 ns in a range of $1 \text{ s} < \tau \leq 10 \text{ s}$, the MTIE value is equal to or shorter than 100 ns in a range of $10 \text{ s} < \tau \leq 100 \text{ s}$, and the MTIE value is equal to or shorter than 700 ns in the range of $100 \text{ s} < \tau \leq 1000 \text{ s}$.

The oscillator according to this application example has such a superior wander performance, compared to the related-art temperature-compensated crystal oscillator, as to fulfill, in a case of keeping the temperature constant at a reference temperature, the condition that the MTIE value is equal to or shorter than 15 ns in the range of $0.1 \text{ s} < \tau \leq 1 \text{ s}$, the MTIE value is equal to or shorter than 23 ns in a range of $1 \text{ s} < \tau \leq 10 \text{ s}$, the MTIE value is equal to or shorter than 100 ns in a range of $10 \text{ s} < \tau \leq 100 \text{ s}$, and the MTIE value is equal to or shorter than 700 ns in the range of $100 \text{ s} < \tau \leq 1000 \text{ s}$. Therefore, the oscillator according to this application example is also applicable for the electronic apparatus and the vehicle for which high frequency stability is required.

APPLICATION EXAMPLE 7

An electronic apparatus according to this application example includes any one of the oscillators described above.

According to this application example, the electronic apparatus equipped with the oscillator having the high frequency stability even in the severe temperature environment can be realized.

APPLICATION EXAMPLE 8

A vehicle according to this application example includes any one of the oscillators described above.

According to this application example, the vehicle equipped with the oscillator having the high frequency stability even in the severe temperature environment can be realized.

BRIEF DESCRIPTION OF THE DRAWINGS

The invention will be described with reference to the accompanying drawings, wherein like numbers reference like elements.

DESCRIPTION OF AN EXEMPLARY EMBODIMENT

A preferred embodiment of the invention will hereinafter be described in detail using the accompanying drawings. It should be noted that the embodiment described below does not unreasonably limit the contents of the invention as set forth in the appended claims. Further, all of the constituents explained hereinafter are not necessarily essential elements of the invention.

1. Oscillator 1.1. Configuration of Oscillator

Figure 1:
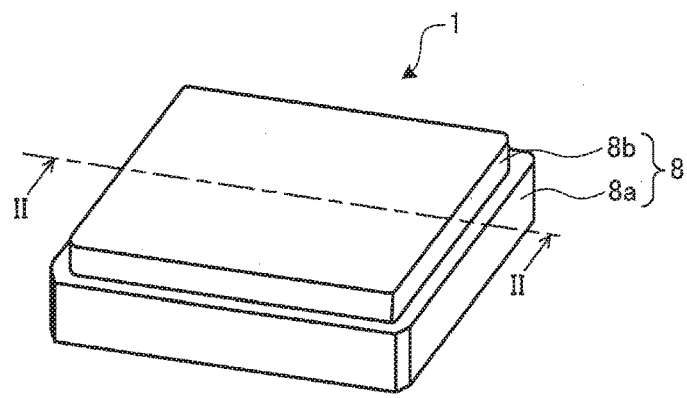
FIG. 1 is a perspective view schematically showing an oscillator according to an embodiment of the invention.
Figure 2:
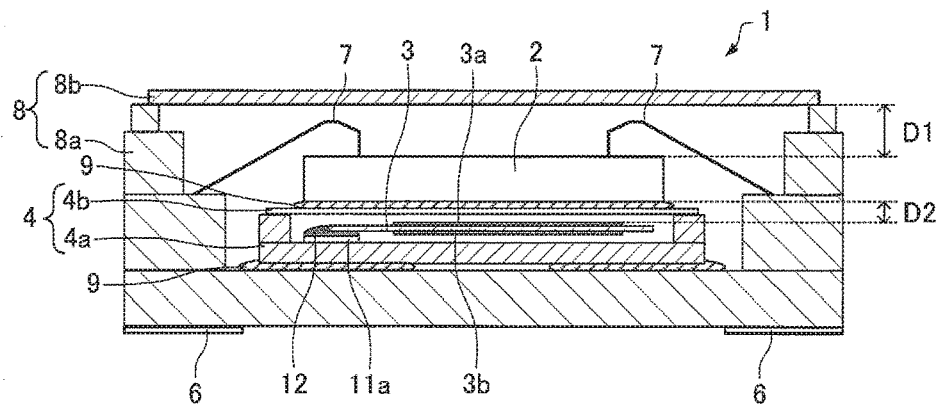
FIG. 2 is a cross-sectional view schematically showing the oscillator according to the embodiment.
Figure 3:
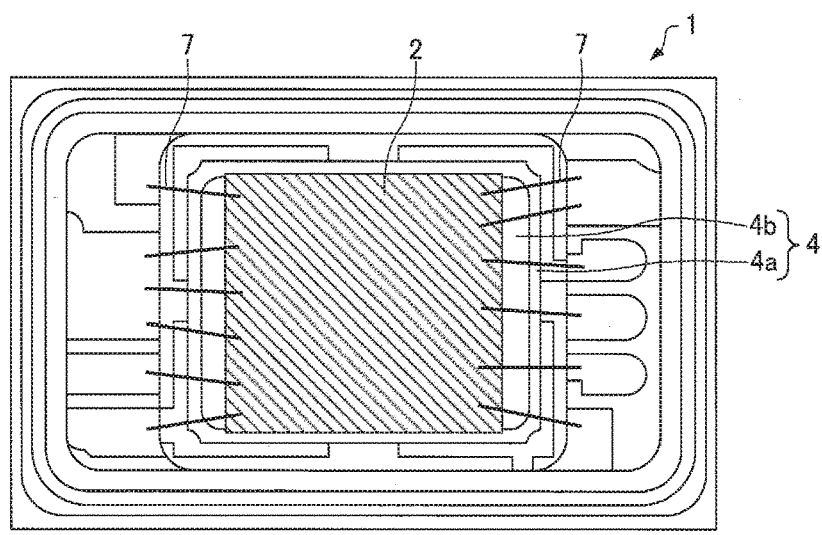
FIG. 3 is a plan view schematically showing the oscillator according to the embodiment.
Figure 4:
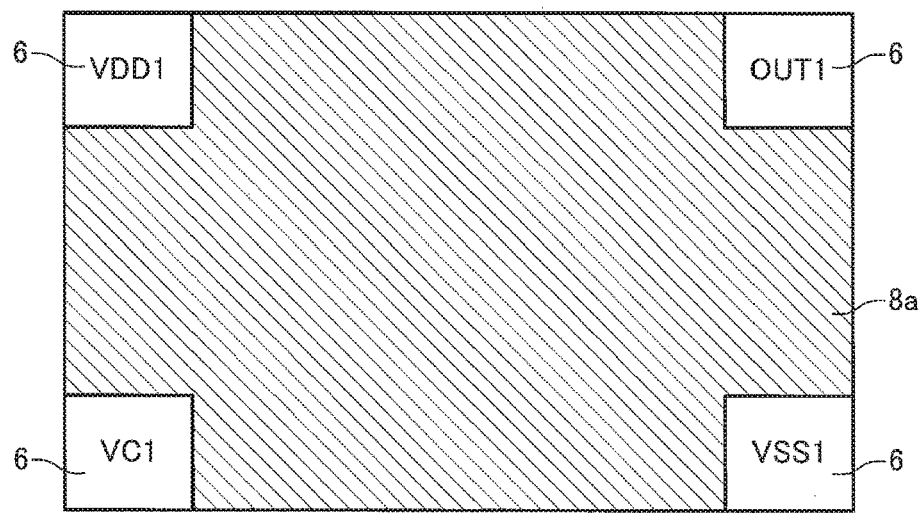
FIG. 4 is a bottom view schematically showing the oscillator according to the embodiment.

FIG. 1 through FIG. 4 are diagrams schematically showing an example of a structure of an oscillator 1 according to the present embodiment. FIG. 1 is a perspective view of the oscillator 1. FIG. 2 is a cross-sectional view along the line II-II in FIG. 1. FIG. 3 is a top view of the oscillator 1. FIG. 4 is a bottom view of the oscillator 1. It should be noted that in FIG. 3, a lid 8b is omitted from the drawing for the sake of convenience.

As shown in FIG. 1 through FIG. 4, the oscillator 1 is configured including an integrated circuit (IC) 2 as an electronic component, a resonator element 3, a package (a first container) 4, and a package (a second container) 8.

The integrated circuit (IC) 2 is housed in the package 8. In the package 8, the integrated circuit (IC) 2 is bonded (fixed) to the package 4 (a lid 4b) with a bonding member 9. As described later, the integrated circuit (IC) 2 is configured including an oscillating circuit 10 and a temperature compensation circuit 40 (see FIG. 6).

As the resonator element 3, there can be used, for example, a quartz crystal resonator element, a surface acoustic wave (SAW) resonator element, other piezoelectric resonator elements, or an MEMS (Micro Electro Mechanical Systems) resonator element. As a substrate material of the resonator element 3, there can be used a piezoelectric material such as a piezoelectric single crystal such as a quartz crystal, lithium tantalate, or lithium niobate, or piezoelectric ceramics such as lead zirconate titanate, a silicon semiconductor material, or the like. As an excitation unit of the resonator element 3, there can be used a device using a piezoelectric effect, or electrostatic drive using Coulomb force.

The resonator element 3 has an excitation electrode 3a and an excitation electrode 3b each made of metal and respectively disposed on the obverse side and the reverse side of the resonator element 3, and oscillates with a desired frequency (a frequency required for the oscillator 1) corresponding to the mass of the resonator element 3 including the excitation electrode 3a and the excitation electrode 3b.

The package 4 includes a base (package base) 4a, and a lid 4b sealing the base 4a. The package 4 houses the resonator element 3. Specifically, the base 4a is provided with a recessed part, and the recessed part is covered with the lid 4b to thereby house the resonator element 3. A space of the package 4 for housing the resonator element 3 is provided with, for example, an inert gas atmosphere with, for example, a nitrogen gas. The base 4a is bonded (fixed) to a base 8a of the package 8 with the bonding member 9 made of lysine or the like.

Figure 5:
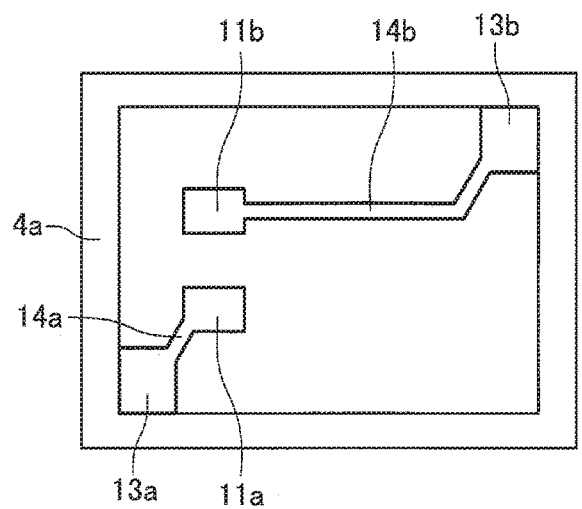
FIG. 5 is a plan view schematically showing a base of a package of the oscillator according to the embodiment.

FIG. 5 is a plan view schematically showing the base 4a of the package 4.

As shown in FIG. 5, on the base 4a, there are disposed electrode pads 11a, 11b, electrode pads 13a, 13b, and extraction interconnections 14a, 14b. It should be noted that in the case of the present embodiment, the base 4a is provided with a base main body shaped like a plate on which the electrode pads 11a, 11b are disposed, and a frame body surrounding the electrode pads 11a, 11b.

The electrode pads 11a, 11b are electrically connected respectively to the two excitation electrodes 3a, 3b of the resonator element 3. To the electrode pads 11a, 11b, there is bonded (fixed) the resonator element 3 with a connection member 12 such as an electrically conductive adhesive.

The electrode pads 13a, 13b are electrically connected respectively to two external terminals (not shown) of the package 4. To the two external terminals of the package 4, there are electrically connected two terminals (an XO terminal and an XI terminal shown in FIG. 6 described later) of the integrated circuit (IC) 2, respectively.

The extraction interconnection 14a electrically connects the electrode pad 11a and the electrode pad 13a to each other. The extraction interconnection 14b electrically connects the electrode pad 11b and the electrode pad 13b to each other.

As shown in FIG. 2, the integrated circuit (IC) 2 is bonded (fixed) to the lid 4b with the bonding member 9. It is desirable for the bonding member 9 to be, for example, an electrically conductive adhesive. As shown in FIG. 3, the integrated circuit (IC) 2 and the package 4 (the resonator element 3) overlap each other in a planar view of the oscillator 1 viewed from the upper surface, and the integrated circuit (IC) 2 is directly mounted on the lid 4b. As described above, in the oscillator 1, by bonding the integrated circuit (IC) 2 to the lid 4b of the package 4 in which the resonator element 3 is housed, the integrated circuit (IC) 2 and the resonator element 3 can be disposed adjacent to each other. Thus, since the heat generated in the integrated circuit (IC) 2 is conducted to the resonator element 3 in a short period of time, the temperature difference between the integrated circuit (IC) 2 and the resonator element 3 can be made small.

The material of the base 4a is not particularly limited, but a variety of types of ceramics such as an aluminum oxide can be used therefor. The material of the lid 4b is, for example, metal. It is desirable for the material of the lid 4b to be a material high in thermal conductivity, and there can be used, for example, nickel (Ni), cobalt (Co), and an iron alloy (e.g., Kovar). Further, it is also possible for the lid 4b to be formed of a plate-like member coated with the metal high in thermal conductivity described above. It should be noted that the material of the plate-like member is not particularly limited. Since the heat generated in the integrated circuit (IC) 2 is conducted to the resonator element 3 in a short period of time by adopting the metal high in thermal conductivity as the material of the lid 4b, the temperature difference between the integrated circuit (IC) 2 and the resonator element 3 can be made small. Further, for example, if at least a part of a surface of the lid 4b having contact with the bonding member 9 is in a coarse state (a coarse surface), the bonding state with the bonding member 9 becomes good to thereby improve impact resistance and a heat exchanging performance. It should be noted that the coarse surface is in the state of having unevenness formed by laser processing, and is coarser compared to, for example, the surface on the housing space side on which such processing is not performed.

It is also possible for the base 4a to be provided with a metal body for sealing disposed between the ceramic member and a seal-bonding part of the lid 4b. The metal body can also be the frame body described above, or can also be disposed on a frame body made of ceramic, or can also be a so-called seam ring made of, for example, a cobalt alloy for seam-sealing, or can also be what has a configuration of directly disposing a metal film on the ceramic member.

In this case, since the metal film is easier to be reduced in thickness than the seam ring, the configuration of disposing the metal film directly on the ceramic member can shorten the distance between the lid 4b and the ceramic member to thereby make it easier to transfer the heat, which transferred from the lid 4b, to the ceramic member, namely the resonator element 3, compared to the case of the seam ring.

Further, it is also possible for the lid 4b to be warped so that the resonator element 3 side becomes in the convex state and the integrated circuit (IC) 2 side becomes in the concave state in the state in which the lid 4b is sealed with the base 4a. If a concave region due to such warpage is located in an area overlapping the integrated circuit (IC) 2, it becomes easy to keep the bonding member 9 in the concave region. Further, due to the above, since sufficient amount of the bonding member 9 can be disposed between the integrated circuit (IC) 2 and the lid 4b, bonding between the integrated circuit (IC) 2 and the lid 4b becomes in good condition, and the heat exchanging performance between the integrated circuit (IC) 2 and the lid 4b and the base 4a, namely between the integrated circuit (IC) 2 and the resonator element 3, is improved.

Further, since the lid 4b is convex toward the resonator element 3, there occurs the state in which the lid 4b is located closer to the resonator element 3 compared to the case in which the lid 4b is completely flat, and it becomes easy for the heat from the integrated circuit (IC) 2 to be transferred to the resonator element 3 via the lid 4b.

It should be noted that as a method of warping the lid 4b, there is prepared the lid 4b which is, for example, flat in the state in which the lid 4b is not fixed to the base 4a, and then the lid 4b and the base 4a are stacked on one another.

After stacking the lid 4b and the base 4a on one another, the lid 4b and the base 4a are bonded to each other while heating the lid 4b and the base 4a.

When thus heating the lid 4b and the base 4a, the temperature of the lid 4b is lowered to a level lower than the temperature of the base main body of the base 4a, or the lid 4b lower in thermal expansion coefficient than the base main body is selected. Alternatively, it is also possible to adopt both of them. Thus, since the lid 4b contracts more than the base 4a when the lid 4b and the base 4a drop in temperature after sealing, the lid 4b can easily be warped.

Further, by also warping the base 4a convexly toward the opposite side to the resonator element 3 side, it is possible to provide a large gap between the base main body and the package 8 described later to thereby degrade the heat exchanging performance between the base 4a and the package 8. It should be noted that it is also possible to provide the base main body constituting the gap with a pad electrode for mounting, and dispose a pad electrode for installation on a surface of the package 8 opposed to the pad electrode for mounting, and then perform solder-bonding between the pad electrode for mounting and the pad electrode for installation. According also to such a configuration, since the solder increases in thickness as much as the increment of the gap compared to the case in which the base 4a is flat, the heat exchanging performance between the base 4a and the package 8 via the solder degrades, and the oscillator 1 hard to be affected by disturbance is obtained.

The package 8 includes a base (package base) 8a, and a lid 8b sealing the base 8a. The package 8 houses the package 4, in which the resonator element 3 is housed, and the integrated circuit (IC) 2 in the same space. Specifically, the base 8a is provided with a recessed part, and the recessed part is covered with the lid 8b to thereby house the integrated circuit (IC) 2 and the package 4. A space of the package 8 for housing the integrated circuit (IC) 2 and the package 4 is provided with, for example, an inert gas atmosphere with, for example, a nitrogen gas.

Between the inner surface of the package 8 and the package 4, there is disposed a space. In the example shown in the drawings, the inner wall surface of the base 8a and the package 4 do not have contact with each other, and a space (gap) is disposed therebetween. Further, the lid 8b and the package 4 do not have contact with each other, and a space (gap) is disposed therebetween.

Between the inner surface of the package 8 and the integrated circuit (IC) 2, there is disposed a space. In the example shown in the drawings, the inner wall surface of the base 8a and the integrated circuit (IC) 2 do not have contact with each other, and a space (gap) is disposed therebetween. Further, the lid 8b and the integrated circuit (IC) 2 do not have contact with each other, and a space (gap) is disposed therebetween.

The material of the base 8a is not particularly limited, but a variety of types of ceramics such as an aluminum oxide can be used therefor. The material of the lid 8b is, for example, metal. The lid 8b of the present embodiment has a plate-like shape (flat shape), and is smaller in area compared to the cap-like shape provided with a recess. Therefore, since it is easy to ward off the wind from the lateral direction of the package, it is possible to prevent the temperature variation due to the outside air. It should be noted that a seal-bonding member is disposed for bonding the base 8a made of ceramic and the lid 8b. The seal-bonding member is a metal seal-bonding member including a material such as a cobalt alloy or Au, or a nonmetal seal-bonding member such as glass or resin.

In the oscillator 1, the distance D1 between the lid 8b of the package 8 and the integrated circuit (IC) 2 is longer than the distance D2 between the integrated circuit (IC) 2 and the resonator element 3. In the example shown in the drawings, the distance D1 is the distance between the lower surface of the lid 8b and the upper surface of the integrated circuit (IC) 2, and the distance D2 is the distance between the lower surface of the integrated circuit (IC) 2 and the upper surface of the resonator element 3. As described above, by locating the integrated circuit (IC) 2 closer to the resonator element 3 than the lid 8b, the temperature difference between the integrated circuit (IC) 2 and the resonator element 3 can be decreased.

On the surfaces of the inside or the recessed part of the base 8a, there are disposed interconnections not shown for electrically connecting two terminals (the XO terminal and the XI terminal shown in FIG. 6 described later) of the integrated circuit (IC) 2 and two terminals (the excitation electrode 3a and the excitation electrode 3b) of the resonator element 3 respectively to each other. Further, on the surfaces of the inside or the recessed part of the base 8a, there are disposed interconnections not shown electrically connected to the respective external terminals 6, and the interconnections and the terminals of the integrated circuit (IC) 2 are respectively bonded to each other with respective bonding wires 7 made of gold or the like.

It should be noted that, for example, if at least a part of a surface of the integrated circuit (IC) 2 having contact with the bonding member 9 is in a coarse state (a coarse surface), the bonding state with the bonding member 9 becomes good to thereby improve the impact resistance and the heat exchanging performance. It should be noted that the coarse surface is a surface in the state of having asperity shaped like streaks or the like formed by, for example, cutting work.

As shown in FIG. 4, the oscillator 1 is provided with four external terminals 6, namely an external terminal VDD1 as a power supply terminal, an external terminal VSS1 as a ground terminal, an external terminal VC1 as a terminal to which a signal for controlling the frequency is input, and an external terminal OUT1 as an output terminal, disposed on the bottom surface (a reverse surface of the base 8a). The external terminal VDD1 is supplied with the power supply voltage, and the external terminal VSS1 is grounded.

Figure 6:
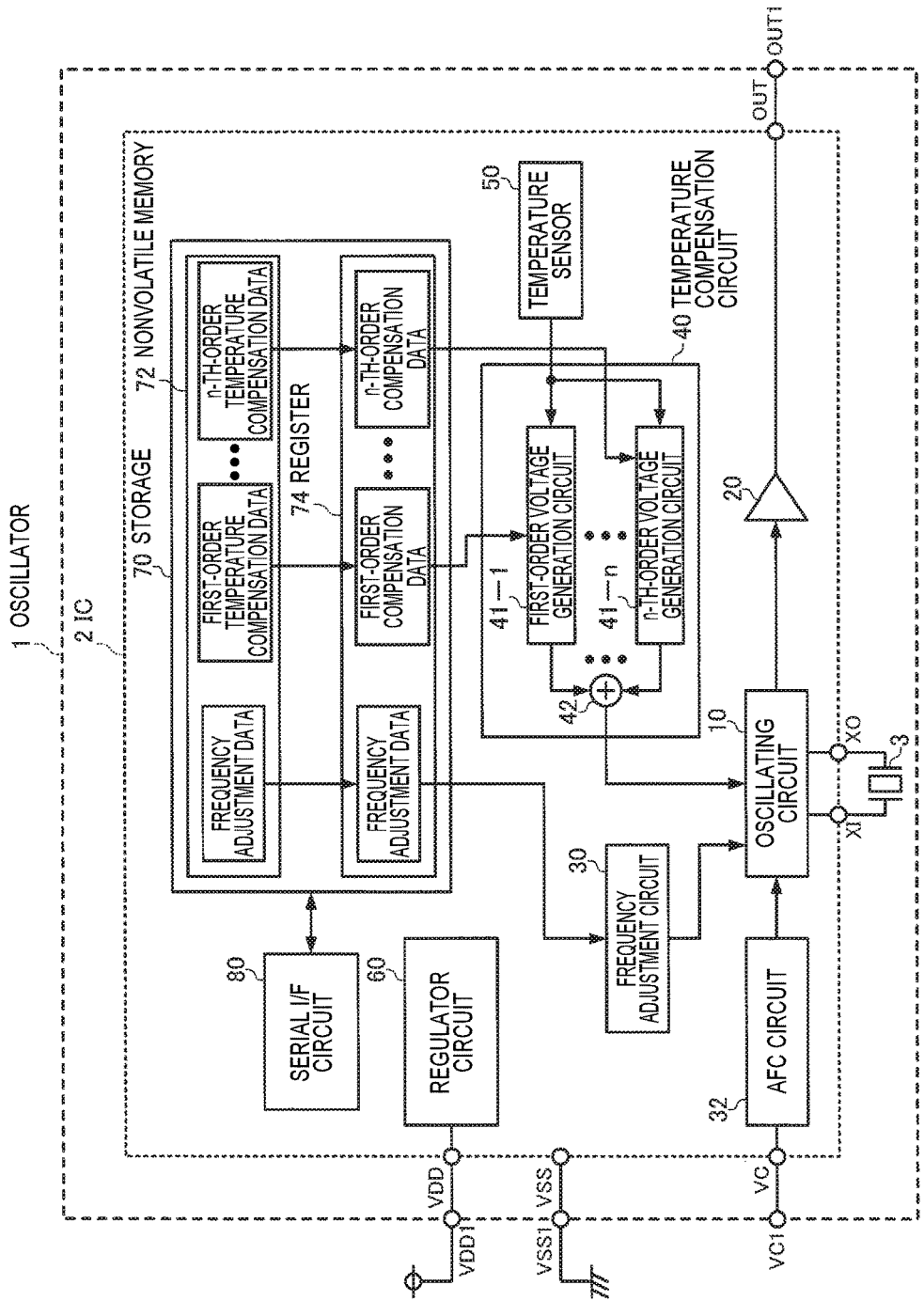
FIG. 6 is a functional block diagram of the oscillator according to the embodiment.

FIG. 6 is a functional block diagram of the oscillator 1. As shown in FIG. 6, the oscillator 1 is an oscillator including the resonator element 3, and the integrated circuit (IC) 2 for oscillating the resonator element 3.

The integrated circuit (IC) 2 is provided with a VDD terminal as a power supply terminal, a VSS terminal as a ground terminal, an OUT terminal as an output terminal, a VC terminal as a terminal to which a signal for controlling the frequency is input, and the XI terminal and the XO terminal as connection terminals with the resonator element 3. The VDD terminal, the VSS terminal, the OUT terminal, and the VC terminal are exposed on the surface of the integrated circuit (IC) 2, and are connected respectively to the external terminals VDD1, VSS1, OUT1, and VC1 provided to the package 8. Further, the XI terminal is connected to one end (one terminal) of the resonator element 3, and the XO terminal is connected to the other end (the other terminal) of the resonator element 3.

In the present embodiment, the integrated circuit (IC) 2 is configured including an oscillating circuit 10, an output circuit 20, a frequency adjustment circuit 30, an automatic frequency control (AFC) circuit 32, a temperature compensation circuit 40, a temperature sensor 50, a regulator circuit 60, a storage 70, and a serial interface (I/F) circuit 80. It should be noted that the integrated circuit (IC) 2 can have a configuration obtained by eliminating or modifying some of these constituents, or adding other constituents.

The regulator circuit 60 generates a constant voltage to be a power supply voltage or a reference voltage of some or all of the oscillating circuit 10, the frequency adjustment circuit 30, the AFC circuit 32, the temperature compensation circuit 40, and the output circuit 20 based on the power supply voltage VDD (positive voltage) supplied from the VDD terminal.

The storage 70 has a nonvolatile memory 72 and a register 74, and is configured so that reading from and writing to the nonvolatile memory 72 or the register 74 can be performed from the external terminals via the serial interface circuit 80. In the present embodiment, since the integrated circuit (IC) 2 has only four terminals to be connected to the external terminals of the oscillator 1, namely the VDD terminal, the VSS terminal, the OUT terminal, and the VC terminal, for example, when the voltage of the VDD terminal is higher than a threshold value, the serial interface circuit 80 accepts a clock signal input from the VC terminal and a data signal input from the OUT terminal, and then performs reading/writing of the data from/to the nonvolatile memory 72 or the register 74.

The nonvolatile memory 72 is a storage for storing a variety of control data, and can be a variety of types of rewritable nonvolatile memory such as an electrically erasable programmable read-only memory (EEPROM) or a flash memory, or can also be a variety of types of non-rewritable nonvolatile memory such as a one-time programmable read-only memory (one-time PROM).

The nonvolatile memory 72 stores frequency adjustment data for controlling the frequency adjustment circuit 30, and temperature compensation data (first-order compensation data, . . . , n-th-order compensation data) for controlling the temperature compensation circuit 40. Further, the nonvolatile memory 72 also stores data (not shown) for respectively controlling the output circuit 20 and the AFC circuit 32.

The frequency adjustment data is the data for adjusting the frequency of the oscillator 1, and in the case in which the frequency of the oscillator 1 is shifted from the desired frequency, it is possible to finely adjust the frequency of the oscillator 1 so as to come closer to the desired frequency by rewriting the frequency adjustment data.

The temperature compensation data (the first-order compensation data, . . . ,the n-th-order compensation data) are the data for compensating the frequency-temperature characteristic of the oscillator 1 and calculated in a temperature compensation adjustment process of the oscillator 1, and can also be, for example, first-order through n-th-order coefficient values corresponding to the respective order components of the frequency temperature characteristic of the resonator element 3. Here, as the highest order n of the temperature compensation data, there is selected a value with which the frequency-temperature characteristic of the resonator element 3 is canceled out, and an influence of the temperature characteristic of the integrated circuit (IC) 2 can also be corrected. For example, the value n can also be an integer value greater than a principal order of the frequency-temperature characteristic of the resonator element 3. For example, if the resonator element 3 is an AT-cut quartz crystal resonator element, the frequency-temperature characteristic exhibits a cubic curve, and since the principal order thereof is three, an integer value (e.g., five or six) greater than three can also be selected as the value n. It should be noted that the temperature compensation data can include all of the first-order through n-th-order compensation data, or some of the first-order through n-th-order compensation data.

Each of the data stored in the nonvolatile memory 72 is transferred from the nonvolatile memory 72 to the register 74 when powering on (when the voltage of the VDD terminal rises from 0 V to a desired voltage) the integrated circuit (IC) 2, and is then held in the register 74. Then, the frequency adjustment data to be held in the register 74 is input to the frequency adjustment circuit 30, the temperature compensation data (the first-order compensation data, . . . , the n-th-order compensation data) to be held in the register 74 are input to the temperature compensation circuit 40, and the data for the control to be held in the register 74 are also input to the output circuit 20 and the AFC circuit 32.

In the case in which the nonvolatile memory 72 is non-rewritable, the data are directly written into the respective bits of the register 74, which holds the data transferred from the nonvolatile memory 72, from the external terminals via the serial interface circuit 80, then adjusted/selected so that the oscillator 1 fulfills the desired characteristic, and then each of the data thus adjusted/selected is finally written into the nonvolatile memory 72 when inspecting the oscillator 1. Further, in the case in which the nonvolatile memory 72 is rewritable, it is also possible to arrange that each of the data is written into the nonvolatile memory 72 from the external terminals via the serial interface circuit 80 when inspecting the oscillator 1. It should be noted that since writing to the nonvolatile memory 72 generally takes time, when inspecting the oscillator 1, in order to shorten the inspection time, it is also possible to arrange that the data are directly written into the respective bits of the register 74 from the external terminals via the serial interface circuit 80, and then each of the data adjusted/selected is finally written into the nonvolatile memory 72.

The oscillating circuit 10 amplifies the output signal of the resonator element 3 to feed back the result to the resonator element 3 to thereby oscillate the resonator element 3, and then outputs an oscillation signal based on the oscillation of the resonator element 3. For example, the oscillation stage current of the oscillating circuit 10 can be controlled by the control data held in the register 74.

The frequency adjustment circuit 30 generates the voltage corresponding to the frequency adjustment data held in the register 74, and then applies the voltage to an end of a variable capacitance element (not shown) functioning as a load capacitance of the oscillating circuit 10. Thus, the oscillation frequency (the reference frequency) of the oscillating circuit 10 at predetermined temperature (e.g., 25° C.) and under the condition in which the voltage of the VC terminal becomes a predetermined voltage (e.g., VDD/2) is controlled (finely adjusted) so as to become roughly the desired frequency.

The AFC circuit 32 generates the voltage corresponding to the voltage of the VC terminal, and then applies the voltage to an end of a variable capacitance element (not shown) functioning as a load capacitance of the oscillating circuit 10. Thus, the oscillation frequency (the oscillation frequency of the resonator element 3) of the oscillating circuit 10 is controlled based on the voltage value of the VC terminal. For example, the gain of the AFC circuit 32 can also be controlled by the control data held in the register 74.

The temperature sensor 50 is a thermosensor for outputting a signal (e.g., a voltage corresponding to the temperature) corresponding to the ambient temperature of the thermosensor. The temperature sensor 50 can be a positive type, in which the higher the temperature is, the higher the output voltage is, or can also be a negative type, in which the higher the temperature is, the lower the output voltage is. It should be noted that a device, the output voltage of which varies as linearly as possible with respect to the change in temperature in a desired temperature range in which the operation of the oscillator 1 is guaranteed, is desirable as the temperature sensor 50.

An output signal from the temperature sensor 50 is input to the temperature compensation circuit 40, and the temperature compensation circuit 40 generates the voltage (temperature compensation voltage) for compensating the frequency-temperature characteristic of the resonator element 3, and then applies the voltage to an end of a variable capacitance element (not shown) functioning as a load capacitance of the oscillating circuit 10. Thus, the oscillation frequency of the oscillating circuit 10 is controlled so as to be roughly constant irrespective of the temperature. In the present embodiment, the temperature compensation circuit 40 is configured including a first-order voltage generation circuit 41-1 through an n-th-order voltage generation circuit 41-n, and an adder circuit 42.

The output signal from the temperature sensor 50 is input to each of the first-order voltage generation circuit 41-1 through the n-th-order voltage generation circuit 41-n, and the first-order voltage generation circuit 41-1 through the n-th-order voltage generation circuit 41-n generate a first-order compensation voltage through an n-th-order compensation voltage for compensating the first-order component through the n-th-order component of the frequency-temperature characteristic in accordance with the first-order compensation data through the n-th-order compensation data held in the register 74, respectively.

The adder circuit 42 adds the first-order compensation voltage through the n-th-order compensation voltage respectively generated by the first-order voltage generation circuit 41-1 through the n-th-order voltage generation circuit 41-n to each other, and then outputs the result. The output voltage of the adder circuit 42 becomes the output voltage (the temperature compensation voltage) of the temperature compensation circuit 40.

The oscillation signal output by the oscillating circuit 10 is input to the output circuit 20, and the output circuit 20 generates an oscillation signal for external output, and then outputs the oscillation signal to the outside via the OUT terminal. For example, the division ratio and the output level of the oscillation signal in the output circuit 20 can be controlled by the control data held in the register 74. The output frequency range of the oscillator 1 is, for example, no lower than 10 MHz and no higher than 800 MHz.

The oscillator 1 configured as described above functions as a voltage-controlled temperature-compensated oscillator (a voltage-controlled temperature-compensated crystal oscillator (VC-TCXO) if the resonator element 3 is a quartz crystal resonator element) for outputting the oscillation signal with a constant frequency corresponding to the voltage of the external terminal VC1 in a desired temperature range irrespective of the temperature.

1.2. Method of Manufacturing Oscillator

Figure 7:
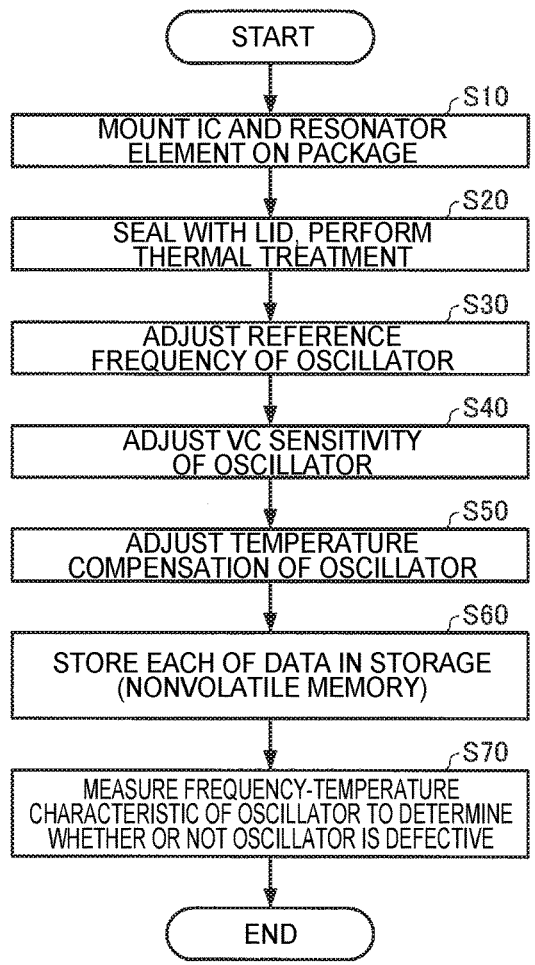
FIG. 7 is a flowchart showing an example of a procedure of a method of manufacturing the oscillator according to the embodiment.

FIG. 7 is a flowchart showing an example of a procedure of a method of manufacturing the oscillator 1 according to the present embodiment. It is also possible to eliminate or modify some of the processes S10 through S70 shown in FIG. 7, or add other processes. Further, it is possible to arbitrarily change the order of the processes to the extent possible.

In the example shown in FIG. 7, firstly, the integrated circuit (IC) 2 and the resonator element 3 (the package 4 housing the resonator element 3) are mounted (S10) on the package 8 (the base 8a). Due to the process S10, the integrated circuit (IC) 2 and the resonator element 3 are connected to each other with interconnections disposed on the surfaces of the inside or the recessed part of the base 8a to achieve the state in which the integrated circuit (IC) 2 and the resonator element 3 are electrically connected to each other when supplying the integrated circuit (IC) 2 with the electrical power.

Then, the base 8a is sealed with the lid 8b, and then a thermal treatment is performed to bond (S20) the lid 8b to the base 8a. Due to the process S20, assembling of the oscillator 1 is completed.

Then, the reference frequency (the frequency at the reference temperature T0 (e.g., 25° C.)) of the oscillator 1 is adjusted (S30). In this process S30, the oscillator 1 is oscillated at the reference temperature T0 to measure the frequency, and then the frequency adjustment data is determined so that the frequency deviation comes closer to zero.

Then, the VC sensitivity of the oscillator 1 is adjusted (S40). In this process S40, the oscillator 1 is oscillated to measure the frequency in the state of applying a predetermined voltage (e.g., 0 V or VDD) to the external terminal VC1 at the reference temperature T0, and then the adjustment data of the AFC circuit 32 is determined so that the desired VC sensitivity can be obtained.

Then, the temperature compensation adjustment of the oscillator 1 is performed (S50). In this temperature compensation adjustment process S50, the frequency of the oscillator 1 is measured at a plurality of temperature points in the desired temperature range (e.g., no lower than −40° C. and no higher than 85° C.), and the temperature compensation data (the first-order compensation data, . . . , the n-th-order compensation data) for correcting the frequency-temperature characteristic of the oscillator 1 are generated based on the measurement result. Specifically, a calculation program for the temperature compensation data approximates the frequency-temperature characteristic (including the frequency-temperature characteristic of the resonator element 3 and the temperature characteristic of the integrated circuit (IC) 2) of the oscillator 1 by an n-th-order formula with the temperature (an output voltage of the temperature sensor 50) as a variable using the measurement result of the frequency at the plurality of temperature points, and then generates the temperature compensation data (the first-order compensation data, the n-th-order compensation data) corresponding to the approximation formula. For example, the calculation program for the temperature compensation data generates such temperature compensation data (the first-order compensation data, . . . , the n-th-order compensation data) as to vanish the frequency deviation at the reference temperature T0, and decrease the width of the frequency deviation in the desired temperature range.

Then, the data respectively obtained in the processes S30, S40, and S50 are stored (S60) in the nonvolatile memory 72 of the storage 70.

Finally, the frequency-temperature characteristic of the oscillator 1 is measured to determine (S70) whether or not the oscillator 1 is defective. In this process S70, the frequency of the oscillator 1 is measured while gradually changing the temperature to evaluate whether or not the frequency deviation is within a predetermined range in the desired temperature range (e.g., no lower than −40° C. and no higher than 85° C.), and if the frequency deviation is within the predetermined range, it is determined that the oscillator 1 is a non-defective product, or if the frequency deviation is not within the predetermined range, it is determined that the oscillator 1 is a defective product.

1.3. Wander Performance of Oscillator

The wander denotes the fluctuation with a frequency lower than 10 Hz among the phase fluctuation of the frequency signal (oscillation signal) output from the oscillator. The wander performance is defined as maximum time interval error (MTIE). The MTIE denotes the maximum value of a peak-to-peak value of the phase fluctuation value in an observation period $\tau$ when dividing the observation result of the phase fluctuation value with respect to the reference clock into observation periods $\tau$. In other words, the maximum value of the peak-to-peak value of the phase fluctuation value with respect to the reference clock in the observation period $\tau$ becomes the MTIE value in the observation period $\tau$.

Figure 8:
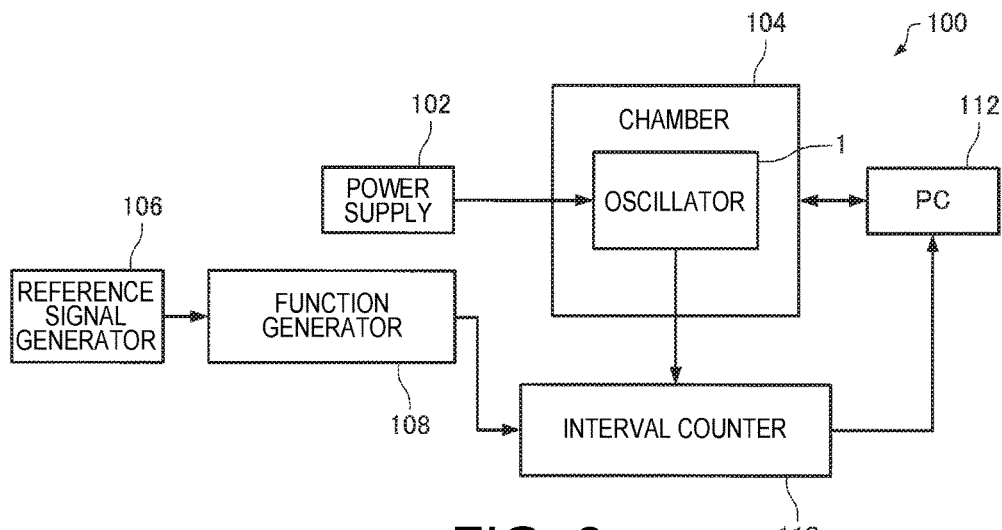
FIG. 8 is a diagram showing a measurement system for evaluating wander performance.

FIG. 8 is a diagram showing a measurement system 100 for evaluating (for measuring the MTIE value) the wander performance of the oscillator 1.

As shown in FIG. 8, the measurement system 100 includes the oscillator 1, a power supply 102, a chamber 104, a reference signal generator 106, a function generator 108, an interval counter 110, and a personal computer (PC) 112.

The configuration of the oscillator 1 used for the present evaluation is as explained in "1.1. Configuration of Oscillator" (see FIG. 1 through FIG. 4) described above. It should be noted that the space of the package 4, in which the resonator element 3 is housed, and the space of the package 8, in which the integrated circuit (IC) 2 and the package 4 are housed, are each provided with a nitrogen gas atmosphere. Further, the resonator element 3 is a quartz crystal resonator element. The oscillator 1 is supplied with the power supply voltage Vcc=3.3 V from the poser supply 102. The output frequency (the nominal frequency) of the oscillator 1 was set to 19.2 MHz. The oscillator 1 is a CMOS output type, and the capacitance load was set to 15 pF.

The oscillator 1 is housed in the chamber 104, the temperature of which can be controlled. The temperature in the chamber 104 is controlled by the PC 112.

In the measurement system 100, the reference signal (reference clock) can be obtained by generating the frequency signal of 19.2 MHz identical to the output frequency of the oscillator 1 using the function generator 108 from the frequency signal of 10 MHz output by the reference signal generator 106.

The measurement target signal (the frequency signal of the oscillator 1) and the reference signal are input to the interval counter 110. In the interval counter 110, the phase fluctuation value of the measurement target signal with respect to the reference signal is measured, and then, the MTIE value is calculated in the PC 112 from the measurement result.

It should be noted that a related-art temperature-compensated crystal oscillator (a comparative sample C1) was prepared as a comparative example, and the evaluation of the wander performance was performed similarly on the comparative sample C1.

Figure 9:
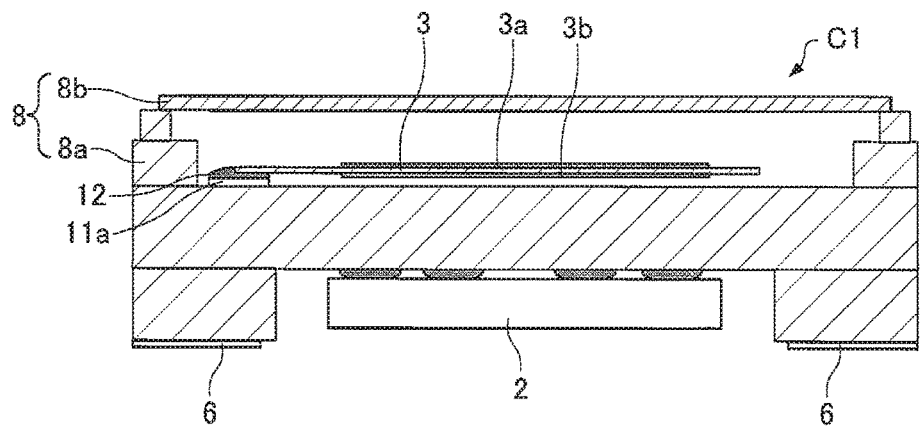
FIG. 9 is a cross-sectional view schematically showing the configuration of a comparative sample.

FIG. 9 is a cross-sectional view schematically showing a configuration of the comparative sample C1.

In the comparative sample C1, as shown in FIG. 9, the base 8a has an H-shaped structure, two principal surfaces of which are each provided with a recessed part. In the comparative sample C1, the resonator element 3 is housed in the recessed part provided to one of the principal surfaces of the base 8a, and the integrated circuit (IC) 2 is housed in the recessed part provided to the other of the principal surfaces. It should be noted that the rest of the configuration of the comparative sample C1 is substantially the same as that of the oscillator 1.

1.3.1. Wander Performance When Varying Temperature

Firstly, the wander performance of the oscillator 1 in the case of varying the temperature in the chamber 104 was evaluated using the measurement system 100 shown in FIG. 8.

Figure 10:
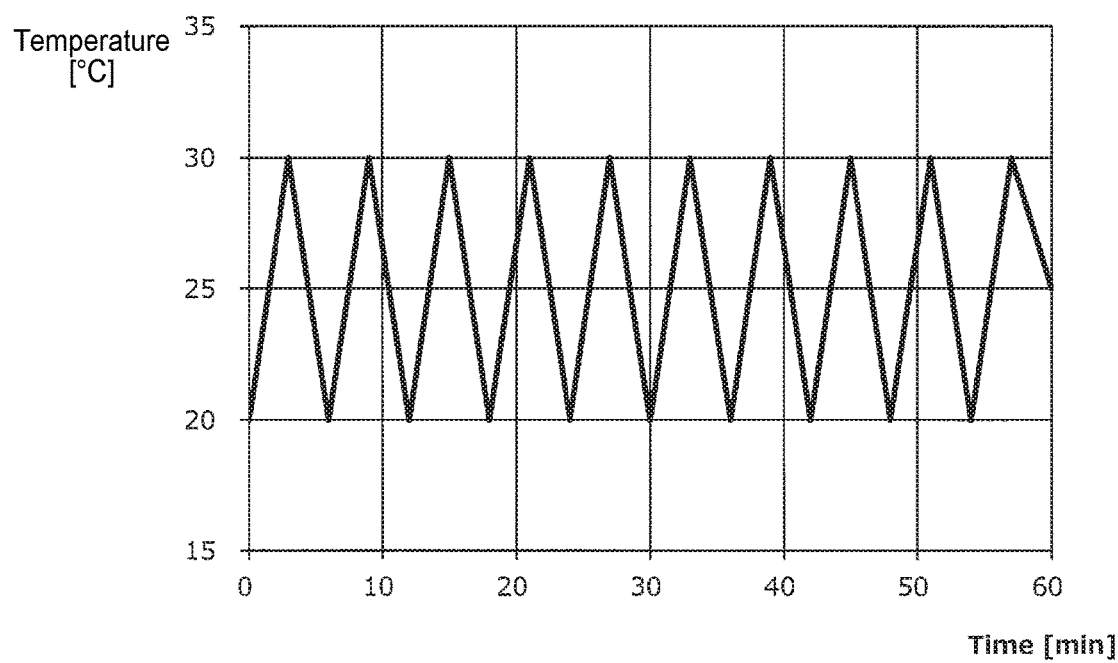
FIG. 10 is a graph showing a temperature profile in a chamber.

FIG. 10 is a graph showing a temperature profile in the chamber 104. It should be noted that the horizontal axis of the graph shown in FIG. 10 represents time (minutes), and the vertical axis represents the temperature in the chamber 104.

Here, in the measurement system 100, the measurement of the MTIE value of the oscillator 1 was performed while varying the temperature in the chamber 104 with the temperature profile shown in FIG. 10. Specifically, as shown in FIG. 10, the temperature in the chamber 104 was varied in the temperature range of ±5° C. centered on the reference temperature T0 (25° C.) in the intervals of 6 minutes. More specifically, it was repeated that the temperature of the chamber 104 was linearly raised for 3 minutes from 20° C. to 30° C. and then linearly dropped for 3 minutes from 30° C. to 20° C.

It should be noted that the similar measurement was performed also on the comparative sample C1.

Figure 11:
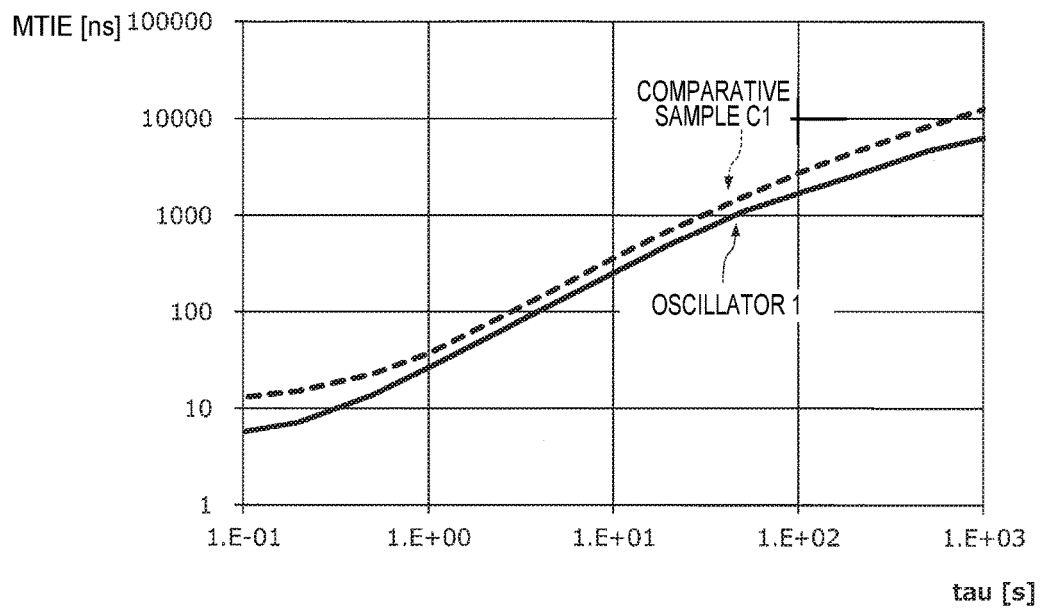
FIG. 11 is a graph showing a evaluation result of the wander performance (temperature fluctuation) of the oscillator according to the embodiment.

FIG. 11 is a graph showing the evaluation result (measurement result of the MTIE value) of the wander performance of the oscillator 1 and the comparative sample C1 in the case in which the temperature was varied in the temperature range of ±5° C. centered on the reference temperature T0 (25° C.) in the intervals of 6 minutes. The horizontal axis of the graph shown in FIG. 11 represents the observation period (tau) $\tau$ (second), and the vertical axis represents the MTIE value ($10^{-9}$ second).

Table 1 described below is a table showing the MTIE value of the oscillator 1 and the comparative sample C1 at $\tau$=0.1 s (second), $\tau$=1 s, $\tau$=10 s, $\tau$=100 s, and $\tau$=1000 s.

TABLE 1

| τ [s] | MTIE value [ns] of oscillator 1 | MTIE value [ns] of comparative sample C1 |
| --- | --- | --- |
| 0.1 | 6 | 13 |
| 1 | 27 | 37 |
| 10 | 246 | 351 |
| 100 | 1678 | 2704 |
| 1000 | 6332 | 12520 |

As shown in FIG. 11 and Table 1, in the oscillator 1, in the case of varying the temperature in the temperature range of ±5° C. centered on the reference temperature T0 (25° C.) in the intervals of 6 minutes, the wander performance fulfills the condition that the MTIE value is equal to or shorter than 6 ns (nanoseconds) in a range of $0 \text{ s} < \tau \leq 0.1 \text{ s}$, the MTIE value is equal to or shorter than 27 ns in a range of $0.1 \text{ s} < \tau \leq 1 \text{ s}$, the MTIE value is equal to or shorter than 250 ns in a range of $1 \text{ s} < \tau \leq 10 \text{ s}$, the MTIE value is equal to or shorter than 1700 ns in a range of $10 \text{ s} < \tau \leq 100 \text{ s}$, and the MTIE value is equal to or shorter than 6300 ns in a range of $100 \text{ s} < \tau \leq 1000 \text{ s}$. As described above, the oscillator 1 has a superior wander performance compared to the comparative sample C1.

1.3.2. Wander Performance When Keeping Temperature Constant at Reference Temperature Then, the wander performance of the oscillator 1 in the case of keeping the temperature in the chamber 104 constant at the reference temperature T0 (25° C.) was evaluated using the measurement system 100 shown in FIG. 8.

Here, in the measurement system 100, the measurement of the MTIE value of the oscillator 1 was performed while keeping the temperature in the chamber 104 constant at the reference temperature T0 (25° C.).

It should be noted that the similar measurement was performed also on the comparative sample C1.

Figure 12:
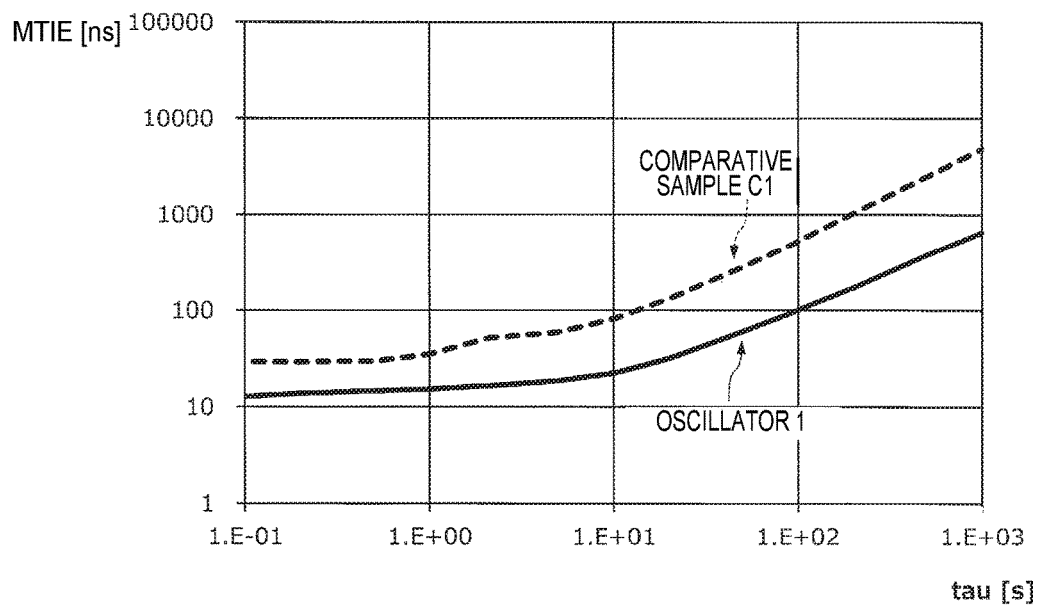
FIG. 12 is a graph showing a evaluation result of the wander performance (constant temperature) of the oscillator according to the embodiment.

FIG. 12 is a graph showing the evaluation result (measurement result of the MTIE value) of the wander performance of the oscillator 1 and the comparative sample C1 in the case in which the temperature in the chamber 104 was kept constant at the reference temperature T0 (25° C.). The horizontal axis of the graph shown in FIG. 12 represents the observation period τ (second), and the vertical axis represents the MTIE value ($10^{-9}$ second).

Table 2 described below is a table showing the MTIE value of the oscillator 1 and the comparative sample C1 at τ=0.1 s, τ=1 s, τ=10 s, τ=100 s, and τ=1000 s.

TABLE 2

| τ [s] | MTIE value [ns] of oscillator 1 | MTIE value [ns] of comparative sample C1 |
| --- | --- | --- |
| 0.1 | 13 | 29 |
| 1 | 15 | 35 |
| 10 | 23 | 83 |
| 100 | 100 | 520 |
| 1000 | 656 | 4825 |

As shown in FIG. 12 and Table 2, in the oscillator 1, in the case of keeping the temperature constant at the reference temperature T0 (25° C.), the wander performance fulfills the condition that the MTIE value is equal to or shorter than 15 ns in the range of $0.1 \text{ s} < \tau \leq 1 \text{ s}$, the MTIE value is equal to or shorter than 23 ns in the range of $1 \text{ s} < \tau \leq 10 \text{ s}$, the MTIE value is equal to or shorter than 100 ns in the range of $10 \text{ s} < \tau \leq 100 \text{ s}$, and the MTIE value is equal to or shorter than 700 ns in the range of $100 \text{ s} < \tau \leq 1000 \text{ s}$. As described above, the oscillator 1 has a superior wander performance compared to the comparative sample C1 even by taking only the condition of the constant temperature.

The oscillator 1 according to the present embodiment has, for example, the following features.

In the oscillator 1, in the case of varying the temperature in the temperature range of ±5° C. centered on the reference temperature T0 (25° C.) in the intervals of 6 minutes, the wander performance fulfills the condition that the MTIE value is equal to or shorter than 6 ns in the range of $0 \text{ s} < \tau \leq 0.1 \text{ s}$, the MTIE value is equal to or shorter than 27 ns in the range of $0.1 \text{ s} < \tau \leq 1 \text{ s}$, the MTIE value is equal to or shorter than 250 ns in the range of $1 \text{ s} < \tau \leq 10 \text{ s}$, the MTIE value is equal to or shorter than 1700 ns in the range of $10 \text{ s} < \tau \leq 100 \text{ s}$, and the MTIE value is equal to or shorter than 6300 ns in the range of $100 \text{ s} < \tau \leq 1000 \text{ s}$.

Here, in ITU-T Recommendation G.813, there is defined the wander performance in the state in which the temperature is constant. In the oscillator 1, the wander performance in the case of varying the temperature fulfills the wander performance in the state in which the temperature is constant as defined in ITU-T Recommendation G.813 in a range of $0 \text{ s} < \tau \leq 100 \text{ s}$. Further, also in the range of $100 \text{ s} < \tau \leq 1000 \text{ s}$, there can be obtained the wander performance equivalent to the wander performance thus defined although inferior to the wander performance thus defined. As described above, in the oscillator 1, there is exerted the superior wander performance even in the environment in which the temperature fluctuates. Therefore, the oscillator 1 is also available for the electronic apparatus and the vehicle for which high frequency stability is required even in the severe temperature environment.

In the oscillator 1, in the case of keeping the temperature constant at the reference temperature T0, the wander performance fulfills the condition that the MTIE value is equal to or shorter than 15 ns in the range of $0.1 \text{ s} < \tau \leq 1 \text{ s}$, the MTIE value is equal to or shorter than 23 ns in the range of $1 \text{ s} < \tau \leq 10 \text{ s}$, the MTIE value is equal to or shorter than 100 ns in the range of $10 \text{ s} < \tau \leq 100 \text{ s}$, and the MTIE value is equal to or shorter than 700 ns in the range of $100 \text{ s} < \tau \leq 1000 \text{ s}$. The wander performance of the oscillator 1 sufficiently fulfills the wander performance defined in ITU-T Recommendation G.813, and the oscillator 1 has the excellent wander performance.

Further, in the oscillator 1, the difference between the wander performance in the case of varying the temperature and the wander performance in the case of keeping the temperature constant is smaller compared to the related-art temperature-compensated crystal oscillator (the comparative sample C1). In other words, it can be said that in the oscillator 1, the deterioration of the wander performance is small even in the severe temperature environment.

As described above, since the oscillator 1 has the superior wander performance even in the severe temperature environment compared to the related-art temperature-compensated crystal oscillator (the comparative sample C1), by using the oscillator 1 for, for example, a communication apparatus as described below, it is possible to realize the communication apparatus having excellent communication performance even in the severe temperature environment. Further, it is possible to apply the oscillator 1 to the electronic apparatus and the vehicle, for which such high frequency stability is required that, for example, the oven-controlled crystal oscillator (OCXO) is used. As a result, down-sizing and power saving of the electronic apparatus and the vehicle are achievable.

The oscillator 1 includes the package 4 housing the resonator element 3, the integrated circuit (IC) 2 provided with the oscillating circuit 10 and the temperature compensation circuit 40, and the package 8 housing the package 4 and the integrated circuit (IC) 2, and the integrated circuit (IC) 2 is bonded to the package 4, the space is disposed between the inner surface of the package 8 and the package 4, and the space is disposed between the inner surface of the package 8 and the integrated circuit (IC) 2. Thus, the heat generated in the integrated circuit (IC) 2 is conducted to the resonator element 3 in a short period of time, and thus the temperature difference between the integrated circuit (IC) 2 and the resonator element 3 is made small. As a result, the error in temperature compensation by the temperature compensation circuit 40 decreases, and thus, the superior wander performance described above can be realized.

In the oscillator 1, the package 4 has the base 4a, and the lid 4b for sealing the base 4a and having the metallic material, and the integrated circuit (IC) 2 is bonded to the lid 4b. Since the material of the lid 4b to which the integrated circuit (IC) 2 is bonded is metal high in thermal conductivity, the heat generated in the integrated circuit (IC) 2 is conducted to the resonator element 3 in a short period of time to decrease the temperature difference between the integrated circuit (IC) 2 and the resonator element 3. As a result, in the oscillator 1, the error in temperature compensation by the temperature compensation circuit 40 decreases, and thus, the superior wander performance described above can be realized.

1.4. Modified Examples of Oscillator

Then, some modified examples of the oscillator according to the present embodiment will be described.

1.4.1. First Modified Example

Figure 13:
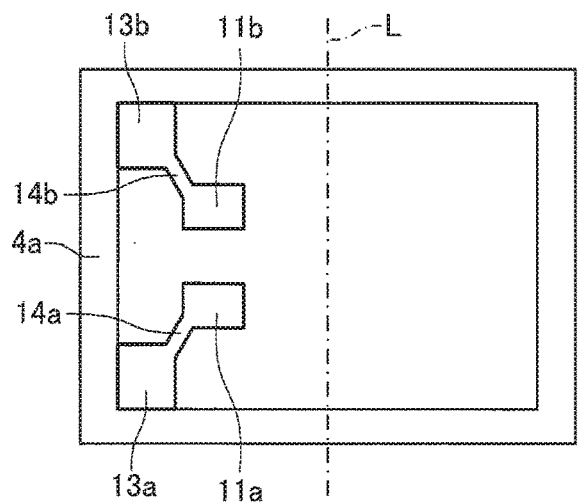
FIG. 13 is a plan view schematically showing a base of a package of an oscillator according to a first modified example.

FIG. 13 is a plan view schematically showing the base 4a of the package 4 of an oscillator according to a first modified example. FIG. 13 corresponds to FIG. 5.

As shown in FIG. 13, in the oscillator according to the first modified example, the arrangement of the electrode pads 11a, 11b, the electrode pads 13a, 13b, and the extraction interconnections 14a, 14b disposed on the base 4a is different from the arrangement shown in FIG. 5 described above.

As shown in FIG. 13, in a planar view (viewed from the normal direction of the bottom surface of the base 4a), when drawing an imaginary straight line L passing through the center of the base 4a to divide the base 4a into two equal parts, the electrode pad 13a and the electrode pad 13b are located in the part where the electrode pad 11a and the electrode pad 11b are disposed. Therefore, the difference in length between the extraction interconnection 14a and the extraction interconnection 14b can be made smaller compared to the arrangement shown in FIG. 5. In the example shown in the drawing, the length of the extraction interconnection 14a and the length of the extraction interconnection 14b are equal to each other.

In the oscillator according to the first modified example, when drawing the imaginary straight line L passing through the center of the base 4a to divide the base 4a into two equal parts in the planar view, the electrode pad 13a and the electrode pad 13b are located in the part where the electrode pad 11a and the electrode pad 11b are disposed. Therefore, it is possible to decrease the difference between the length of the extraction interconnection 14a and the length of the extraction interconnection 14b. Thus, it is possible to decrease the difference between the path length of the path through which the heat from the outside of the package 4 is transferred to the resonator element 3 via the electrode pad 13a, the extraction interconnection 14a and the electrode pad 11a, and the path length of the path through which the heat is transferred to the resonator element 3 via the electrode pad 13b, the extraction interconnection 14b and the electrode pad 11b.

As a result, compared to the example of the oscillator 1 shown in FIG. 5 described above, for example, the temperature variation of the resonator element 3 can be reduced, and thus, the temperature difference between the integrated circuit (IC) 2 and the resonator element 3 can further be decreased. Therefore, according to the first modified example, it is possible to realize the oscillator having the wander performance superior to the wander performance of the oscillator 1 shown in FIG. 11 and FIG. 12 described above.

1.4.2. Second Modified Example

Although in the embodiment described above, the space of the package 4 for housing the resonator element 3 and the space of the package 8 for housing the integrated circuit (IC) 2 and the package 4 are provided with the nitrogen gas atmosphere, it is also possible to provide these spaces with a helium gas atmosphere. Since the helium gas is higher in thermal conductivity compared to the nitrogen gas, the temperature difference between the integrated circuit (IC) 2 and the resonator element 3 can further be decreased. As a result, according to the present modified example, it is possible to realize the oscillator having the wander performance superior to the wander performance of the oscillator 1 shown in FIG. 11 and FIG. 12 described above.

Further, it is also possible to arrange that the space of the package 4 for housing the resonator element 3 is provided with the inert gas atmosphere such as the nitrogen gas, or the helium gas, and the space of the package 8 (the space for housing the integrated circuit (IC) 2 and the package 4) is in the vacuum state (the state in which the pressure is lower than the atmospheric pressure). Thus, it is possible to reduce the influence of the temperature variation outside the package 8 on the integrated circuit (IC) 2 and the resonator element 3 while decreasing the temperature difference between the integrated circuit (IC) 2 and the resonator element 3. As a result, according to the present modified example, it is possible to realize the oscillator having the wander performance superior to the wander performance of the oscillator 1 shown in FIG. 11 and FIG. 12 described above.

2. Electronic Apparatus

Figure 14:
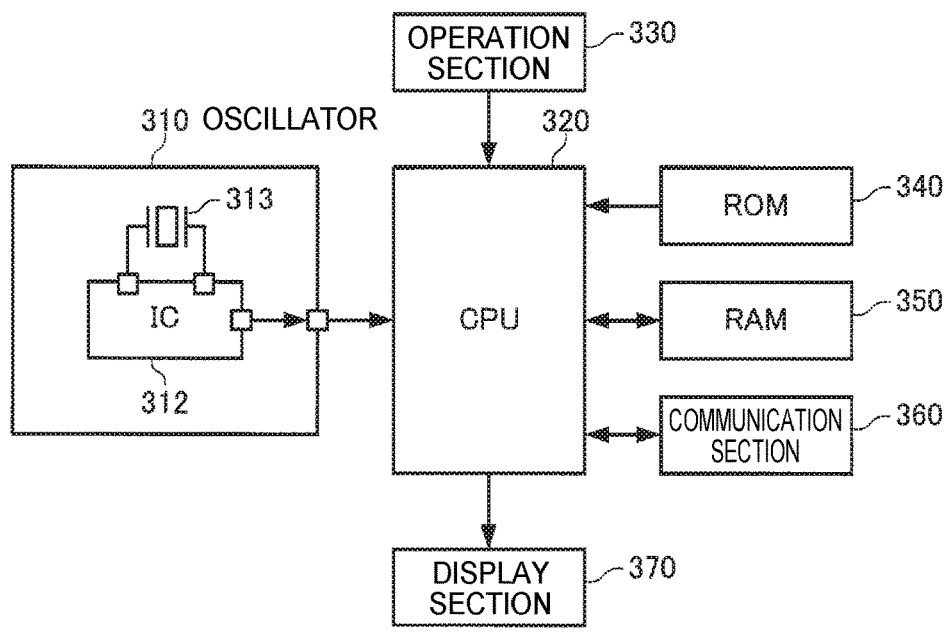
FIG. 14 is a functional block diagram showing an example of a configuration of an electronic apparatus according to the embodiment.
Figure 15:
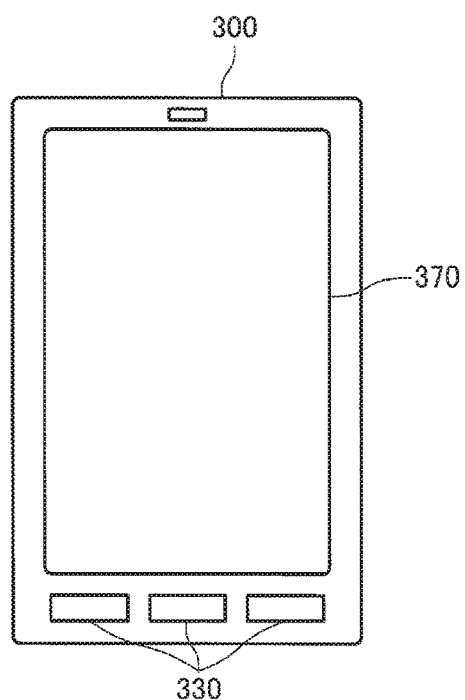
FIG. 15 is a diagram showing an example of an external view of the electronic apparatus according to the embodiment.

FIG. 14 is a functional block diagram showing an example of a configuration of an electronic apparatus according to the present embodiment. Further, FIG. 15 is a diagram showing an example of the appearance of a smartphone as an example of the electronic apparatus according to the present embodiment.

The electronic apparatus 300 according to the present embodiment is configured including an oscillator 310, a central processing unit (CPU) 320, an operation section 330, a read only memory (ROM) 340, a random access memory (RAM) 350, a communication section 360, and a display section 370. It should be noted that the electronic apparatus according to the present embodiment can be provided with a configuration obtained by eliminating or modifying some of the constituents (sections) shown in FIG. 14, or adding other constituents thereto.

The oscillator 310 is provided with an integrated circuit (IC) 312 and a resonator 313. The integrated circuit (IC) 312 oscillates the resonator 313 to generate an oscillation signal. The oscillation signal is output from an external terminal of the oscillator 310 to the CPU 320.

The CPU 320 performs a variety of types of arithmetic processing and control processing using the oscillation signal input from the oscillator 310 as a clock signal in accordance with the program stored in the ROM 340 and so on. Specifically, the CPU 320 performs a variety of processes corresponding to the operation signal from the operation section 330, a process of controlling the communication section 360 for performing data communication with external devices, a process of transmitting a display signal for making the display section 370 display a variety of types of information, and so on.

The operation section 330 is an input device constituted by operation keys, button switches, and so on, and outputs the operation signal corresponding to the operation by the user to the CPU 320.

The ROM 340 stores the programs, data, and so on for the CPU 320 to perform the variety of types of arithmetic processing and control processing.

The RAM 350 is used as a working area of the CPU 320, and temporarily stores, for example, the programs and the data retrieved from the ROM 340, the data input from the operation section 330, and the calculation result obtained by the CPU 320 performing operations in accordance with the variety of types of programs.

The communication section 360 performs a variety of types of control for achieving the data communication between the CPU 320 and the external devices.

The display section 370 is a display device formed of a liquid crystal display (LCD) or the like, and displays a variety of types of information based on the display signal input from the CPU 320. The display section 370 can also be provided with a touch panel, which functions as the operation section 330.

By applying, for example, the oscillator 1 described above as the oscillator 310, it is possible to realize the electronic apparatus equipped with the oscillator having an excellent wander performance even in the severe temperature environment.

As such an electronic apparatus 300, a variety of electronic apparatuses can be adopted, and there can be cited, for example, a personal computer (e.g., a mobile type personal computer, a laptop personal computer, and a tablet personal computer), a mobile terminal such as a smartphone or a cellular phone, a digital camera, an inkjet ejection device (e.g., an inkjet printer), a storage area network apparatus such as a router ora switch, a local area network apparatus, an apparatus for a mobile terminal base station, a television set, a video camera, a video cassette recorder, a car navigation system, a real-time clock device, a pager, a personal digital assistance (including one having a communication function), an electronic dictionary, an electronic calculator, an electronic game machine, a gaming controller, a word processor, a workstation, a picture phone, a security television monitor, electronic binoculars, a POS terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments, gauges (e.g., gauges for cars, aircrafts, and boats and ships), a flight simulator, a head-mount display, a motion tracer, a motion tracker, a motion controller, and a pedestrian dead reckoning (PDR) system.

As an example of the electronic apparatus 300 according to the present embodiment, there can be cited a transmission device using the oscillator 310 described above as a reference signal source, a voltage-controlled oscillator (VCO), or the like, and functioning as, for example, a terminal base station device for performing communication with terminals wirelessly or with wire. By applying the oscillator as the oscillator 310, it is possible to realize the electronic apparatus, for which the high performance and the high reliability are required, and which is available for, for example, the communication base station.

Further, as another example of the electronic apparatus 300 according to the present embodiment, it is possible to adopt a communication device in which the communication section 360 receives an external clock signal, and the CPU 320 (the processing section) includes a frequency control section for controlling the frequency of the oscillator 310 based on the external clock signal and the output signal (an internal clock signal) of the oscillator 310. The communication device can be a communication apparatus used for, for example, a backbone network apparatus such as Stratum-3, or a femtocell.

3. Vehicle

Figure 16:
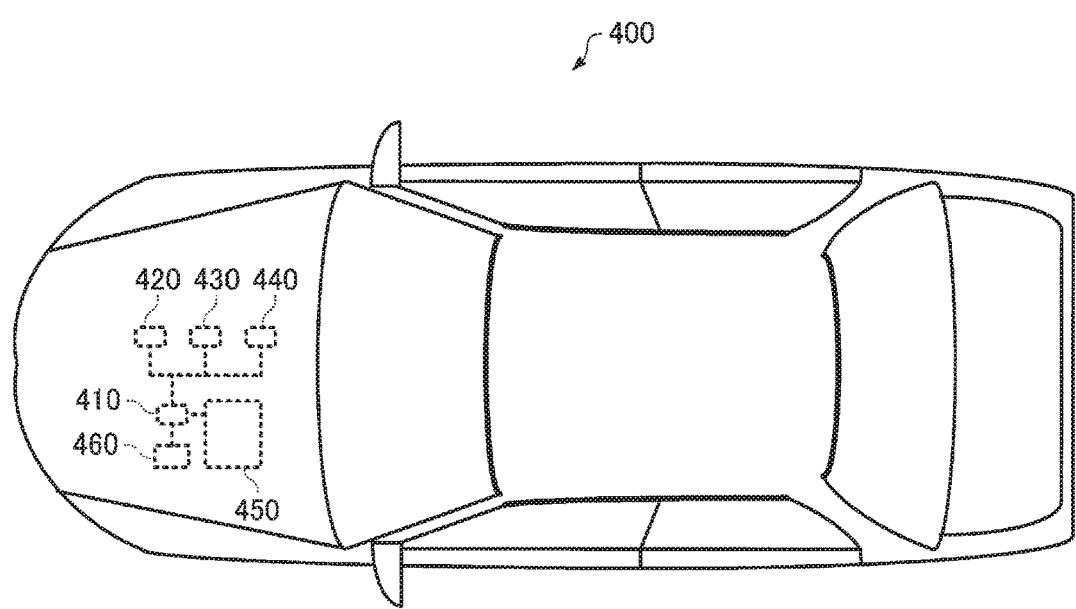
FIG. 16 is a diagram showing an example of a vehicle according to the embodiment.

FIG. 16 is a diagram (a top view) showing an example of a vehicle according to the present embodiment. The vehicle 400 shown in FIG. 16 is configured including an oscillator 410, controllers 420, 430, and 440 for performing a variety of types of control such as an engine system, a brake system, and a keyless entry system, a battery 450, and a backup battery 460. It should be noted that the vehicle according to the present embodiment can have a configuration obtained by eliminating some of the constituents (sections) shown in FIG. 16, or adding other constituents thereto.

The oscillator 410 is provided with an integrated circuit (IC) and a resonator element not shown, and the integrated circuit (IC) oscillates the resonator element to generate the oscillation signal. The oscillation signal is output from the external terminal of the oscillator 410 to the controllers 420, 430, and 440, and is used as, for example, a clock signal.

The battery 450 supplies the oscillator 410 and the controllers 420, 430, and 440 with electrical power. The backup battery 460 supplies the oscillator 410 and the controllers 420, 430, and 440 with the electrical power when the output voltage of the battery 450 drops to a level lower than a threshold value.

By applying, for example, the oscillator 1 described above as the oscillator 410, it is possible to realize the vehicle equipped with the oscillator having an excellent wander performance even in the severe temperature environment.

As such a vehicle 400, there can be adopted a variety of types of vehicles, and there can be cited a car (including an electric car), an aircraft such as a jet plane ora helicopter, a ship, a boat, a rocket, an artificial satellite, and so on.

The invention is not limited to the embodiment, but can be implemented with a variety of modifications within the scope or the spirit of the invention.

The embodiment and the modified examples described above are illustrative only, and the invention is not limited to the embodiment and the modified examples. For example, it is also possible to arbitrarily combine any of the embodiment and the modified examples described above with each other.

The invention includes configurations (e.g., configurations having the same function, the same way, and the same result, or configurations having the same object and the same advantage) substantially the same as the configuration described as the embodiment of the invention. Further, the invention includes configurations obtained by replacing a non-essential part of the configuration described as the embodiment of the invention. Further, the invention includes configurations providing the same functions and advantages and configurations capable of achieving the same object as the configuration described as the embodiment of the invention. Further, the invention includes configurations obtained by adding known technologies to the configuration described as one of the embodiments of the invention.

The entire disclosure of Japanese Patent Application No.2016-055870, filed Mar. 18, 2016 is expressly incorporated by reference herein.

What is claimed is:

1. A temperature-compensated oscillator comprising:
a resonator element;
an oscillating circuit;
a temperature compensation circuit;
a first container housing the resonator element, the first container including:
a base, and
a lid adapted to seal the base and made of metal;
an electronic component provided with the oscillating circuit and the temperature-compensation circuit, the electronic component being bonded to the lid of the first container; and
a second container housing the first container and the electronic component,
wherein a space is disposed between each inner surface of the second container and the electronic component, such that there is no direct contact between the second container and the electronic component, and
in a case of varying a temperature in a temperature range of ±5° C. centered on a reference temperature in intervals of 6 minutes, and assuming an observation period as $\tau$, a wander performance fulfills a condition that
a maximum time interval error (MTIE) value is less than or equal to 6 ns in a range of $0\ s<\tau\leq 0.1\ s$,
the MTIE value is less than or equal to 27 ns in a range of $0.1\ s<\tau\leq 1\ s$,
the MTIE value is less than or equal to 250 ns in a range of $1\ s<\tau\leq 10\ s$,
the MTIE value is less than or equal to 1700 ns in a range of $10\ s<\tau\leq 100\ s$, and
the MTIE value is less than or equal to 6332 ns in a range of $100\ s<\tau\leq 1000\ s$.

2. The oscillator according to claim 1, wherein
in a case of keeping the temperature constant at the reference temperature, the wander performance fulfills a condition that
the MTIE value is less than or equal to 15 ns in the range of $0.1\ s<\tau\leq 1\ s$,
the MTIE value is less than or equal to 23 ns in the range of $1\ s<\tau\leq 10\ s$,
the MTIE value is less than or equal to 100 ns in the range of $10\ s<\tau\leq 100\ s$, and
the MTIE value is less than or equal to 700 ns in the range of $100\ s<\tau\leq 1000\ s$.

3. The oscillator according to claim 1, wherein
the space in the second container is in a vacuum state.

4. The oscillator according to claim 2, wherein
the space in the second container is in a vacuum state.

5. An electronic apparatus comprising:
the oscillator according to claim 1.

6. An electronic apparatus comprising:
the oscillator according to claim 2.

7. A vehicle comprising:
the oscillator according to claim 1.

8. A vehicle comprising:
the oscillator according to claim 2.

9. A temperature-compensated oscillator comprising:
a resonator element;
an oscillating circuit;
a temperature compensation circuit;
a first container housing the resonator element, the first container including:
a base, and
a lid adapted to seal the base and made of metal;
an electronic component provided with the oscillating circuit and the temperature-compensation circuit, the electronic component being bonded to the lid of the first container; and
a second container housing the first container and the electronic component,
wherein a space is disposed between each inner surface of the second container and the electronic component, such that there is no direct contact between the second container and the electronic component, and
in a case of keeping a temperature constant at a reference temperature, a wander performance fulfills a condition that
a maximum time interval error (MTIE) value is less than or equal to 15 ns in a range of $0.1\ s<\tau\leq 1\ s$,
the MTIE value is less than or equal to 23 ns in a range of $1\ s<\tau\leq 10\ s$,
the MTIE value is less than or equal to 100 ns in a range of $10\ s<\tau\leq 100\ s$, and
the MTIE value is less than or equal to 700 ns in a range of $100\ s<\tau\leq 1000\ s$.

10. An electronic apparatus comprising:
the oscillator according to claim 9.

11. A vehicle comprising:
the oscillator according to claim 9.

* * * * *